(12) United States Patent
Oota

(10) Patent No.: US 8,587,053 B2
(45) Date of Patent: Nov. 19, 2013

(54) SEMICONDUCTOR DEVICE HAVING REDUCED ON-RESISTANCE CHARACTERISTICS

(75) Inventor: Tomonari Oota, Osaka (JP)

(73) Assignee: Panasonic Corporation, Osaka (JP)

( * ) Notice: Subject to any disclaimer, the term of this patent is extended or adjusted under 35 U.S.C. 154(b) by 217 days.

(21) Appl. No.: 13/168,562

(22) Filed: Jun. 24, 2011

(65) Prior Publication Data

US 2011/0316074 A1 Dec. 29, 2011

(30) Foreign Application Priority Data

Jun. 25, 2010 (JP) .................................. 2010-145022

(51) Int. Cl.
*H01L 29/66* (2006.01)
(52) U.S. Cl.
USPC .......................................... 257/330; 438/270
(58) Field of Classification Search
USPC .......... 257/330, 331, E21.262, 329, 332, 333, 257/334, 335; 438/270
See application file for complete search history.

(56) References Cited

U.S. PATENT DOCUMENTS

2006/0124996 A1  6/2006  Mizokuchi et al.
2009/0114982 A1*  5/2009  Saka et al. .................... 257/330

FOREIGN PATENT DOCUMENTS

JP    2005-032792    2/2005
JP    2006-196876    7/2006

* cited by examiner

*Primary Examiner* — Julio J Maldonado
*Assistant Examiner* — Robert Bachner
(74) *Attorney, Agent, or Firm* — McDermott Will & Emery LLP

(57) ABSTRACT

A shape of an upper edge of a trench is realized as an upwardly-open tapered surface $T_2$, thereby reducing contact resistance without involvement of an increase in pitch for trench formation. Specifically, the trench has the tapered surface along the edge of an opening. A contact surface between a source region and a source electrode filled on the tapered surface makes up a source-contact region.

3 Claims, 7 Drawing Sheets

(a)

(b)

(c)

SEMICONDUCTOR DEVICE HAVING REDUCED ON-RESISTANCE CHARACTERISTICS

BACKGROUND OF THE INVENTION

1. Field of the Invention

The present invention relates to a semiconductor device and a method for manufacturing the semiconductor device and, more particularly, to reduction of on-resistance of a semiconductor device, like an insulated gate transistor having a trench structure.

2. Description of the Related Art

With recent reduction of power consumption, sophistication, and speedup of electronic devices, including portable phones, semiconductor devices to be mounted in the electronic devices have also been required to pursue further reduction of power consumption and greater speedups. In order to meet the demands, transistors used in load switches, DC-DC converters, and the like, of general electronic devices have been required to exhibit smaller on-resistance. One proposed method for reducing on-resistance of a transistor is to increase the density of transistors to be placed per unit area by miniaturizing individual devices. Specifically, in relation to a vertical MOSFET including gate electrodes fabricated in respective trenches, the trenches formed in the trenches making up the transistor are arranged in a stripe pattern, to thus reduce widths of the respective trenches. Further, pitches among adjacent trenches are reduced, thereby making it possible to increase the density of the transistor.

The T-MOSFET is a MOSFET that utilizes sidewalls of respective trenches as channels by embedding gate electrodes in the respective trenches by way of a gate insulation film.

FIG. 7 (corresponding to FIG. 1 of Patent Document 1) shows a structure of a typical N-channel T-MOS. By means of epitaxial growth, an epitaxial layer 1810 is formed on a silicon substrate that is an $N^+$-type semiconductor substrate 1800 doped with N-type impurities (of first conductivity type). The epitaxial layer 1810 includes an N-type drain region 1811, a P-type body region 1812 formed on the N-type drain region 1811, an $N^+$-type source region 1813 formed on the body region 1812; and a $P^+$-type body contact region 1814 that is formed so as to adjoin the source region 1813 and that is higher than the body region 1812 in terms of an impurity concentration. A trench that penetrates through the source region 1813 and the body region 1812, to thus reach an upper portion of the drain region 1811, is provided in the epitaxial layer 1810. A vertical gate electrode 1820 is embedded in the trench. A topmost surface of the vertical gate electrode 1820 is formed so as to be situated below a surface of the epitaxial layer 1810 where the source region 1813 exists. An upper area of the trench located above the vertical gate electrode 1820 is filled with an insulation film 1830. An insulating material 1840 that is to serve as a gate insulation film lies between the vertical gate electrode 1820 and walls; namely, a wall of the drain region 1811 and walls of the body region 1812 which are to act as vertical walls of the trench. Further, a common electrode 1850 connected commonly to the source region 1813 and the body contact region 1814 is formed on a surface of the epitaxial layer 1810.

In order to meet the demand for further reduction of on-resistance, miniaturization of a chip; namely, an increase in current density, and an increase in current density, various proposed techniques have been contrived to miniaturize trench pitches to a much greater extent.

FIG. 8 shows an example technique for miniaturizing a trench pitch in a T-MOS described in connection with Patent Document 2. In order to reduce the trench pitch, a width of the trench and spacing between trenches are reduced. If the width of the pitch is reduced with the structure shown in FIG. 7 being kept intact, an area of the source region 1813 and an area of the body contact region 1814 will become smaller. Consequently, contact resistance existing between a body contact electrode metal serving as the common electrode 1850 and the regions; namely, the source region 1813 and the body contact region 1814, will increase, which will pose difficulty in reducing on-resistance as targeted. In Patent Document 2, upper edges of trenches 2140 are given a "round shape" for these reasons as shown in FIG. 8. The number of trenches is reduced by increasing the length of a channel per trench (i.e., the length of a gate electrode 2120), thereby increasing spacing between the trenches and effectively increasing an area of the body contact and an area of a source contact. An increase in contact resistance, which would otherwise stem from miniaturization of the trench pitch, can be thereby prevented. Use of the technique can be said to make it possible to reduce the trench pitch from a trench pitch on the order of micrometers to a trench pitch on the order of submicrons; specifically, to a value of 1 micrometers or less.

Patent Document 1: JP-2005-32792
Patent Document 2: JP-2006-196876

However, a demand for reduction of on-resistance recently grows more than ever with further miniaturization of an element. Currently available workarounds for this demand are to merely control the resistance of the epitaxial layer 1810. For this reason, additional reduction of on-resistance has been strongly desired.

Under the circumstances, a configuration of the trench greatly affects element characteristics. In particular, contact resistance in the source contact located in the vicinity of trench openings and resistance in the source region give rise to increase in on-resistance.

SUMMARY OF THE INVENTION

The present invention has been conceived in light of the circumstances and aims at reducing on-resistance by accomplishing additional reduction of source resistance.

To this end, the present inventors conducted various tests over and over again and found that contact resistance could be reduced without involvement of an increase in pitch for trench formation by means of providing upper edges of the respective trenches with tapered surfaces that extend toward an opening.

A semiconductor device of the present invention comprises: a drain region formed from a semiconductor region of first conductivity type; a body region formed from a semiconductor region of second conductivity type made on the drain region; a source region formed from the semiconductor region of first conductivity type formed within the body region; a body contact region that is formed in an area which lies in the body region but differs from the source region and that is formed from a highly-doped semiconductor region of second conductivity type; trenches formed so as to extend from the source region to the drain region while passing through the body region; a gate electrode formed within each of the trenches; a source electrode formed so as to contact the source region and the body contact region; and a drain electrode formed in the drain region, wherein each of the trenches has a tapered surface spreading outside from an edge of an opening; and wherein an area between the source region and the source electrode filled in each of the trenches makes up a source-contact region.

The present invention is also characterized by the semiconductor device, wherein each of the trenches has a vertical surface whose cross section extends in a vertical direction and a tapered surface that is formed along an upper edge of the vertical surface so as to extend outside from an edge of an opening; and wherein each of the tapered surfaces is formed so as to extend from a marginal edge of an insulation film covering the gate electrode up to an upper edge of the source region.

The present invention is also characterized by the semiconductor device, wherein the semiconductor device is a SiMOSFET formed on a silicon substrate.

The present invention is also characterized by comprising: a step of forming a semiconductor layer of first conductivity type on a semiconductor substrate of first conductivity type through epitaxial growth; a step of introducing impurities of second conductivity type in the semiconductor layer of first conductivity type while a semiconductor region of first conductivity type which is to become a drain region is left, thereby forming a body region of second conductivity type; a step of forming trenches at a desired pitch so as to reach the drain region; a step of forming a source region from the semiconductor region of first conductivity type formed in the body region made of a semiconductor region of second conductivity type formed on the drain region; a step of forming a body contact region, from a heavily doped semiconductor region of second conductivity type, in an area that is in the body region and that differs from the source region; forming a gate electrode in each of the trenches; a step of forming a source electrode so as to cover the gate electrodes with an insulation film and to contact the source region and the body contact region; and a step of forming a drain electrode so as to contact the drain region, wherein the step of forming the trenches includes: a step of forming an oxide film on a surface of the semiconductor substrate where the body region of second conductivity type is formed, to thus form a mask pattern from the oxide film, a first step of forming tapered surfaces corresponding to an opening by means of isotropic etching while the mask pattern is taken as a mask, and a second step of forming vertical surfaces by means of anisotropic etching.

As above, according to the present invention, the source region makes up a tapered surface opened toward an opening, and a contact area (a source-contact region) between the source region and the source electrode is increased by about 20%. Further, the source electrode is increased by an amount corresponding to reduction of the source region, and on-resistance can be significantly reduced.

DESCRIPTION OF THE PREFERRED EMBODIMENTS

An embodiment of the present invention is hereunder described in detail by reference to the drawings.
(First Embodiment)

Figure 1:
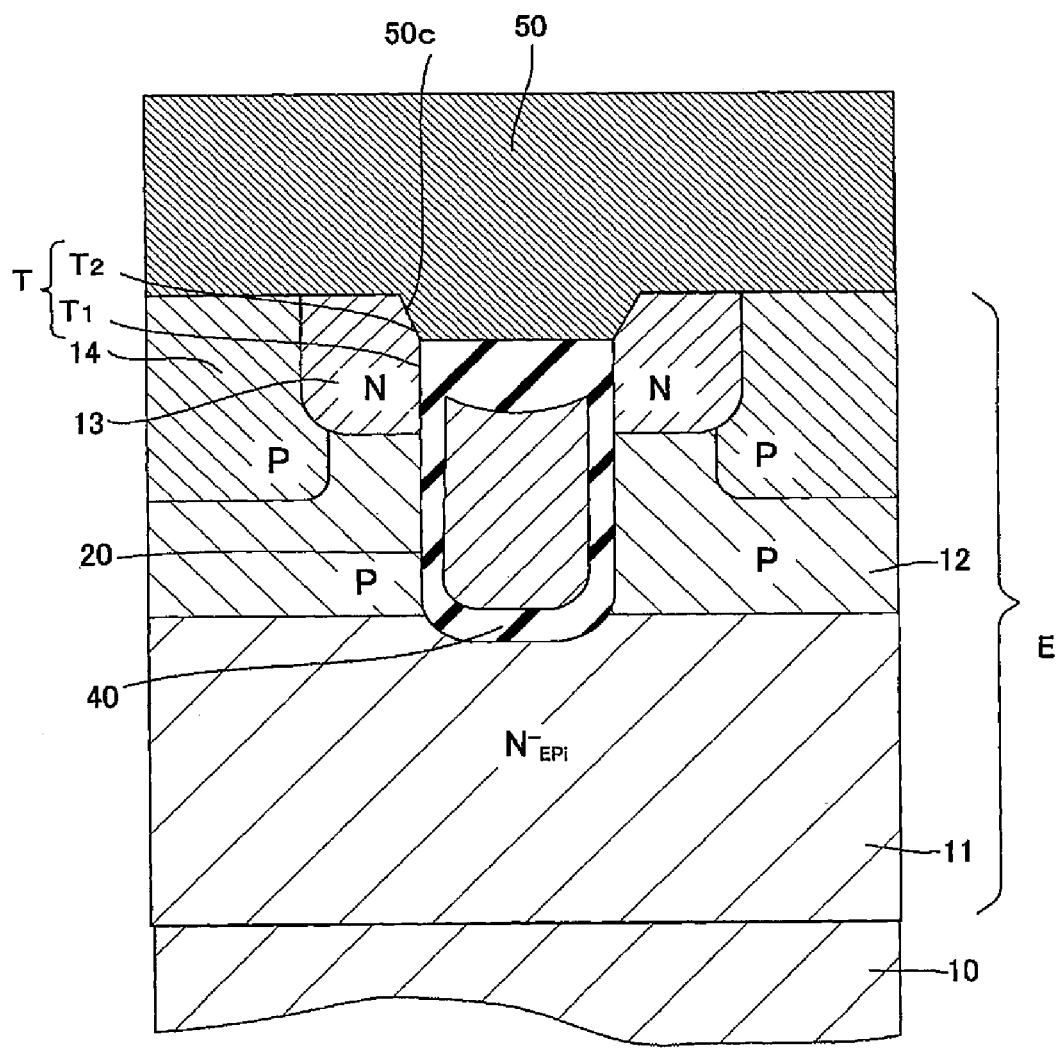
FIG. 1 is a cross sectional profile showing a T-MOSFET of a first embodiment of the present invention.
Figure 2:
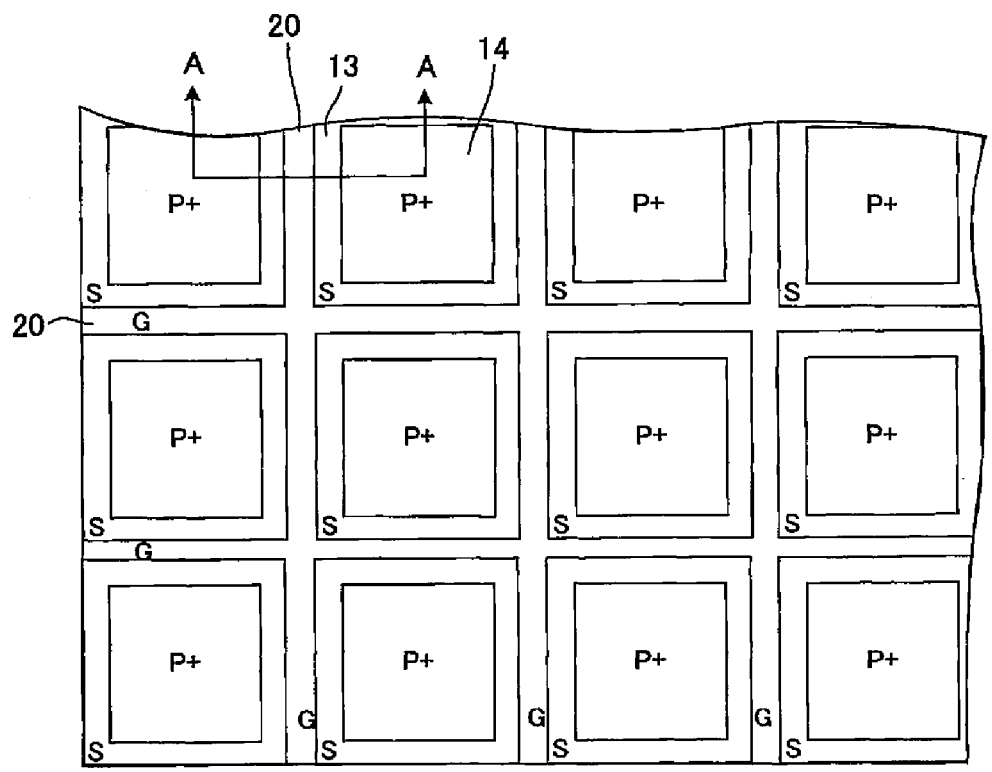
FIG. 2 is a top view shown in FIG. 1.
Figure 3:
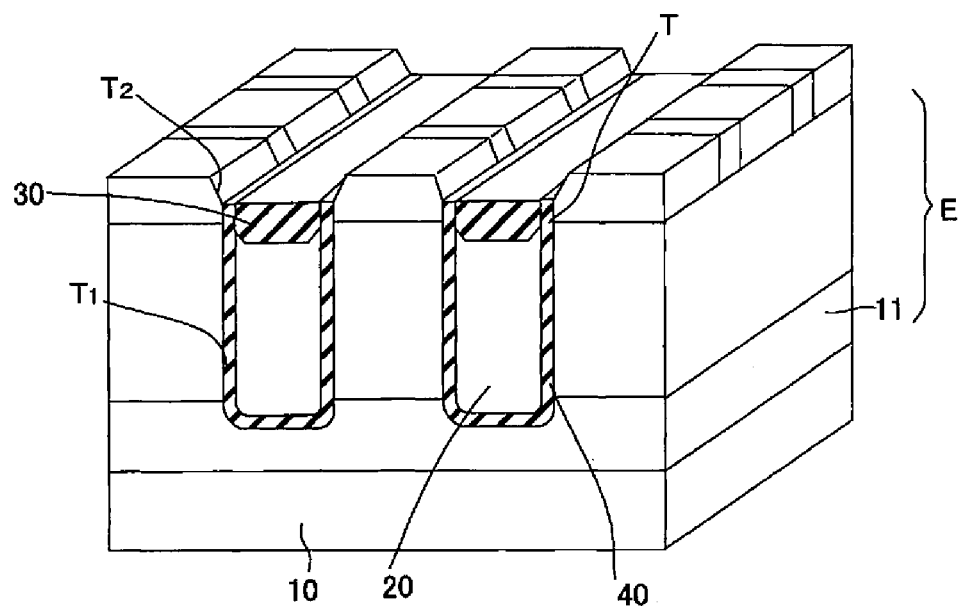
FIG. 3 is an oblique perspective view showing the T-MOSFET of the first embodiment of the present invention.
Figure 4:
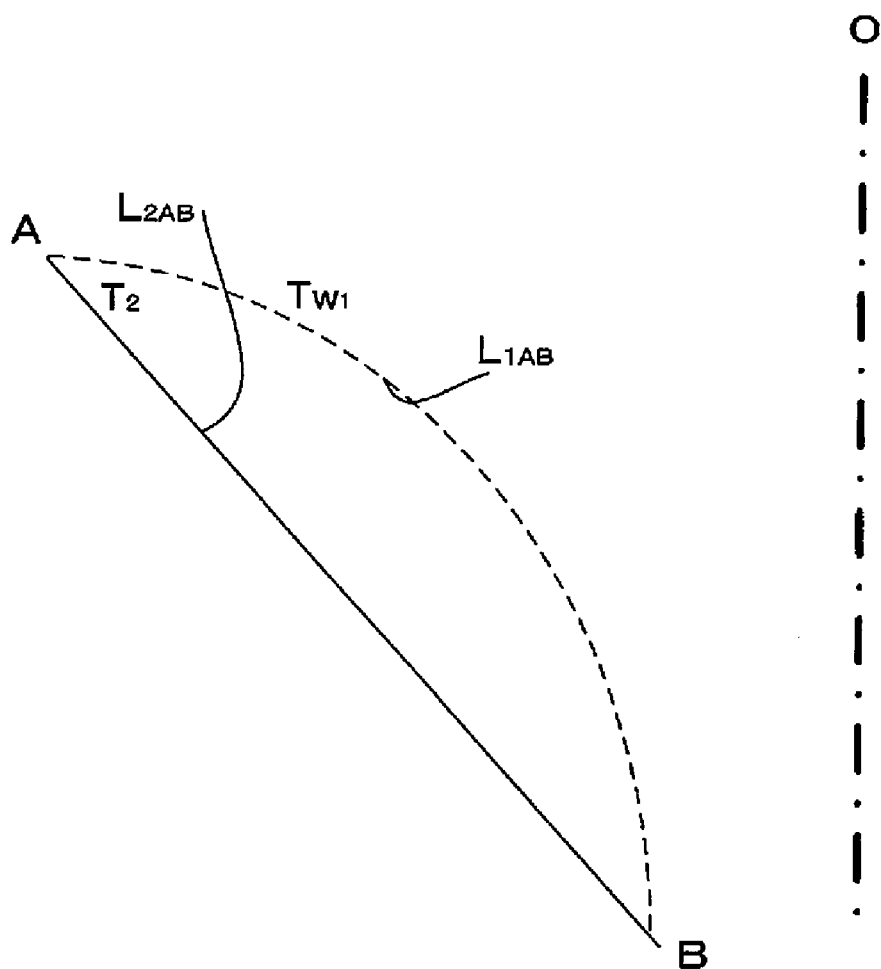
FIG. 4 is a descriptive view of a trench profile of the T-MOSFET of the first embodiment of the present invention.

FIGS. 1 through 3 are drawings showing a T-MOSFET of a first embodiment including trenches. FIG. 4 is a descriptive view of a trench profile. FIGS. 5A to 5D and FIGS. 6A to 6C are cross sectional profiles showing an overview of steps of a method for manufacturing a semiconductor device of the present invention. FIG. 1 is a cross sectional profile; FIG. 2 is a top view; and FIG. 3 is an oblique perspective view. FIG. 1 is a view showing a cross sectional profile taken along line A-A shown in FIG. 2.

A characteristic of the T-MOSFET of the first embodiment lies in the following configuration of a trench T. The trench T has a tapered surface $T_2$ whose cross section spreads to the outside at an edge of an opening and also has substantially linear tapering. Spacing between a source electrode 50 filled along the tapered surface $T_2$ and a source electrode 50 formed along the tapered surface $T_2$ makes up a source contact region 50C.

As illustrated in cross section of FIG. 1, the T-MOSFET includes a drain region 11 made of an N-type epitaxial layer formed on a surface of an N$^+$-type silicon substrate 10; a body region 12 made of a P-type well region formed on the drain region 11; a source region 13 made of a P-type region formed in the body region 12; a body contact region 14 made of a P$^+$-type region formed at an area that is in the body region 12 but different from an area of the source region 13; the trench T formed so as to extend from the source region 13 and penetrate through the body region 12, to thus reach the drain region 11; a gate electrode 20 made of a polysilicon layer that is formed in the trench T by way of a silicon oxide film 40 serving as a gate insulation film; the source electrode 50 formed so as to contact the source region 13 and the body contact region 14; and a drain electrode formed as a drain region on the N-type silicon substrate 10.

On the occasion of manufacture of the T-MOSFET, a step of forming the trench T includes forming a mask pattern for a silicon oxide film 30 and subjecting the film to two-stage etching by way of the mask pattern. The trench T resultantly has a vertical surface $T_1$ whose cross section extends in the vertical direction and a tapered surface $T_2$ formed so as to adjoin an upper edge of the vertical surface. The tapered surface $T_2$ is formed so as to extend from a marginal edge of an insulation film covering the gate electrode 20 up to an upper edge of the source region. As shown in a descriptive view of FIG. 4, an upper portion of the trench T makes up a tapered surface whose cross section becomes linear. Specifically, a straight line $L_{2AB}$ corresponding to a cross section of a tapered surface is rotated around a center axis O, to thus draw a body of revolution. A surface area of the body of revolution is a contact area $S_{1AB}$ (see FIG. 3). In the meantime, an upper edge of a trench Tw1 described in connection with Patent Document 2 leads to a round tapered surface whose cross section spreads upwardly. Specifically, an upwardly convex curve $L_{1AB}$ is rotated around the center axis O, to thus draw a body of revolution. A surface area of the body of revolution is a contact area $S_{1AB}$.

Distances from the center axis O to all points belonging to the straight line $L_{2AB}$ are larger than distances from the center axis O to all points belonging to the line $L_{1AB}$. Accordingly, a surface area $S_{2AB}$ of the body of revolution whose radii are the distances from the center axis O to all of the points belonging to the straight line $L_{2AB}$ is greater than the surface area $S_{1AB}$ of the body of revolution whose radii are the distances from the center axis O to all of the points belonging to the curve $L_{1AB}$.

Therefore, there is derived a relationship of $S_{2AB} > S_{1AB}$.

As mentioned above, the contact area $S_{2AB}$ of the trench including the tapered surface obviously becomes larger than the contact area $S_{1AB}$ of the trench having the curved surface whose cross section upwardly projects.

Figure 7:
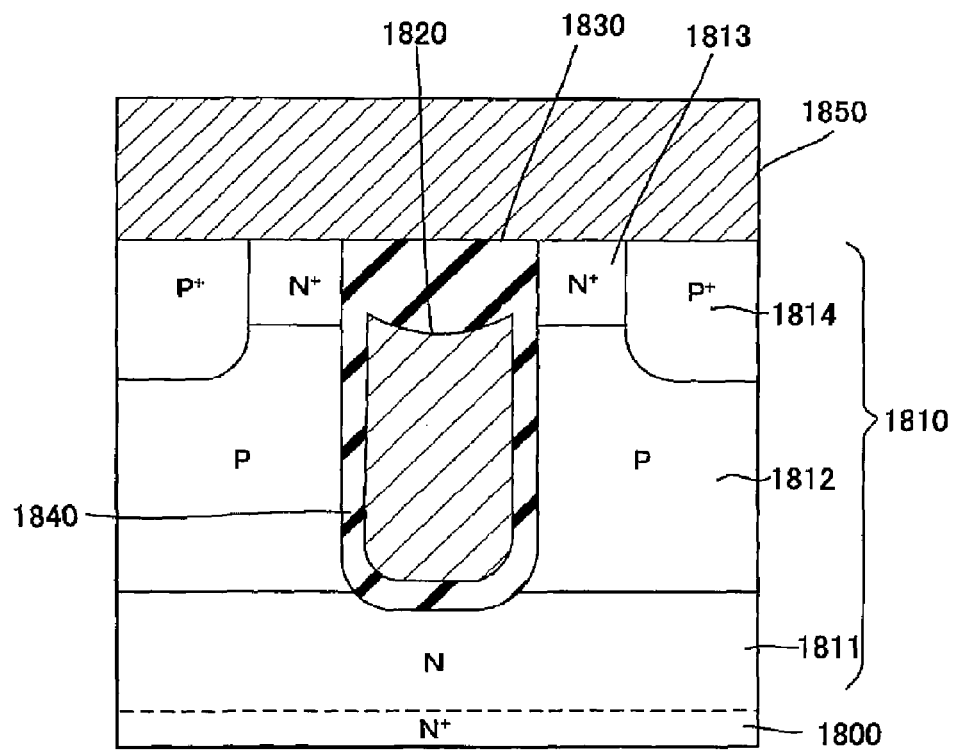
FIG. 7 is a cross sectional profile showing a related art T-MOSFET.
Figure 8:
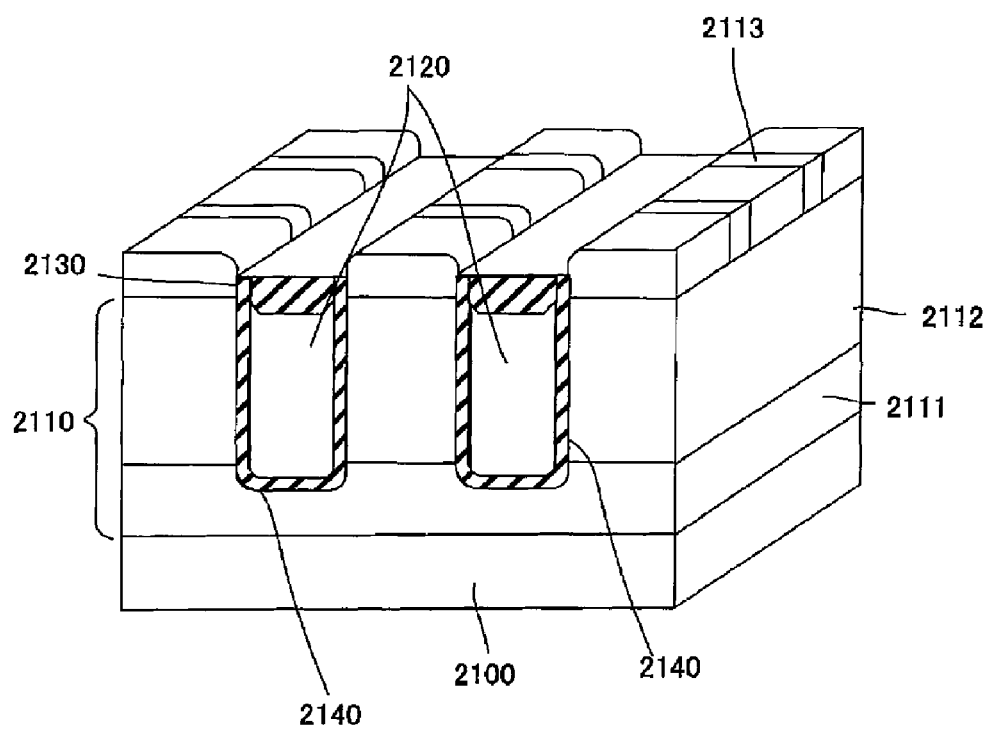
FIG. 8 is a descriptive view showing the related art T-MOSFET.

It is understood from the above that the T-MOSFET is significantly improved as compared to the T-MOSFET shown in FIG. 7 having the upwardly convex shape in terms of the contact area between the source region and the source electrode. It is also obvious that the source electrode is increased by an amount corresponding to a reduction in the source region.

On-resistance of the T-MOSFET of the present embodiment is thus understood to be made smaller than on-resistance of the related art T-MOSFET. In reality, the contact area of the T-MOSFET of the present embodiment is increased as compared with the related-art T-MOSFET by about 20%. Further, the source electrode is increased by an amount of the reduction in the source region. Thus, on-resistance can be significantly reduced. Further, a break in a step, which would otherwise arise during formation of a source electrode, can be prevented. Moreover, the appearance and reliability of the T-MOSFET are also enhanced.

The T-MOSFET of the embodiment is hereunder described by reference to the drawings.

The T-MOSFET of the embodiment is basically analogous to the N-channel T-MOSFET described in connection with Patent Document 1. As shown in FIGS. 1 through 3, an epitaxial layer E is formed, by means of epitaxial growth, on the $N^+$-type silicon substrate 10 serving as a semiconductor substrate doped with N-type (a first conductivity type) impurities. A bottom of the epitaxial layer E is taken as the N-type drain region 11. An impurity diffused region is formed in the epitaxial layer E. Formed on the drain region 11 are the P-type body region 12, the $N^+$-type source region 13 that is formed on a surface of the body region 12; and the $P^+$-type body contact region 14 that is formed so as to adjoin the source region 13 and doped with impurities of the same conductivity type so as to become higher than the body region 12 in terms of a doping level. The trenches T are formed in the epitaxial layer E so as to penetrate through the source region 13 and the body region 12 and reach an upper portion of the drain region 11. The vertical gate electrodes 20 made of doped polysilicon are embedded in the respective trenches T. The topmost surface of the vertical gate electrode 20 is situated at a position lower than the surface of the epitaxial layer E in the source region 13 by an amount corresponding to a predetermined depth. A space above the vertical gate electrode 20 within the trench T is filled with the silicon oxide film 30 that is to serve as an insulation film. The silicon oxide film 40 that is to become a gate insulation film is interposed between the vertical gate electrode 20 and surfaces of the drain region 11 and the body region 12 that respectively become vertical walls of the trench. Further, the source electrode 50 serving as a common electrode, which is commonly connected to the source region 13 and the body contact region 14, is provided on the epitaxial layer E.

A method for manufacturing the T-MOSFET of the present invention is now described.

First, the epitaxial layer E is formed on the N+-type silicon substrate 10 serving as a semiconductor substrate by means of epitaxial growth. A silicon oxide layer having a thickness of about 700 nm is formed on the surface of the epitaxial layer E by means of thermal oxidation. A mask to be used for forming a P-type well region is made. The silicon oxide layer is patterned by use of the mask. The silicon oxide layer is doped with P-type impurities by means of ion implantation, thereby forming the P-type well region that is to become the body region 12.

Figure 5:
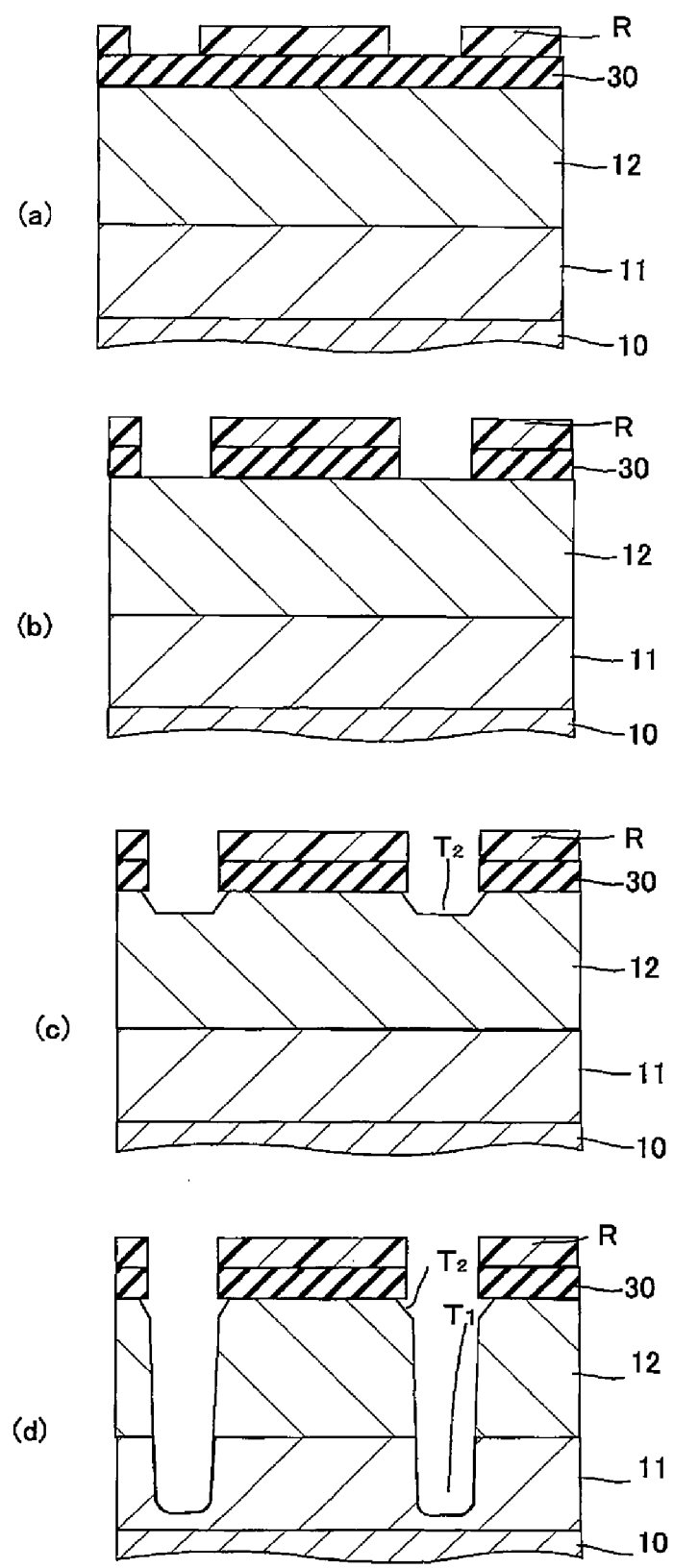
FIGS. 5A to 5D are cross sectional profiles showing processes for manufacturing the T-MOSFET of the first embodiment of the present invention.

Subsequently, a resist pattern R used for forming trenches is made as shown in FIG. 5A.

As shown in FIG. 5B, the silicon oxide film 30 is patterned while the resist pattern R is taken as a mask.

As shown in FIG. 5C, trenches each of which has the tapered surface $T_2$ are formed by use of tetrafluorocarbon ($CF_4$)+oxygen ($O_2$) as an etching gas while the silicon oxide film 30 is taken as a mask and through dry etching that is conducted at a temperature of 50 to 100 degrees centigrade for 0.5 to 2 minutes. The volume of $CF_4$ was here set so as to become one to five times the quantity of $O_2$.

As shown in FIG. 5D, the trenches T whose cross sections are formed from the vertical surfaces $T_1$ were formed by means of anisotropic etching performed for two to four minutes at a temperature of 50 to 100 degrees centigrade while a fluorine-based gas+Ar+oxygen is used as an etching gas. Each of the trenches T is formed such that a width of an area surrounded by the vertical surfaces $T_1$ comes to 60 mm and that a width of an opening between the tapered surfaces comes to 800 mm.

Figure 6:
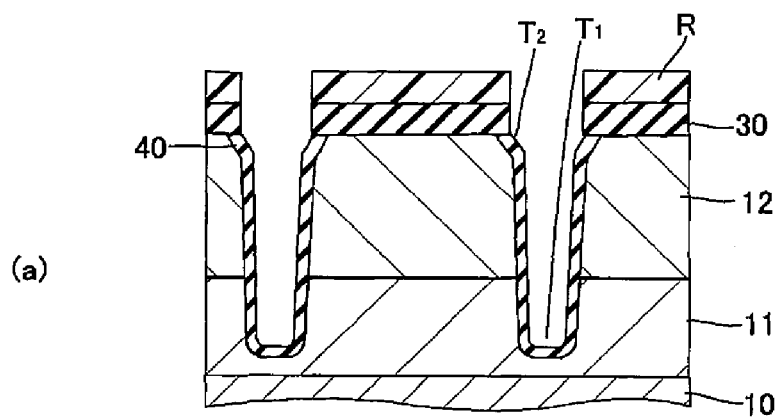
FIGS. 6A to 6C are cross sectional profiles showing processes for manufacturing the T-MOSFET of the first embodiment of the present invention.
Figure 6:
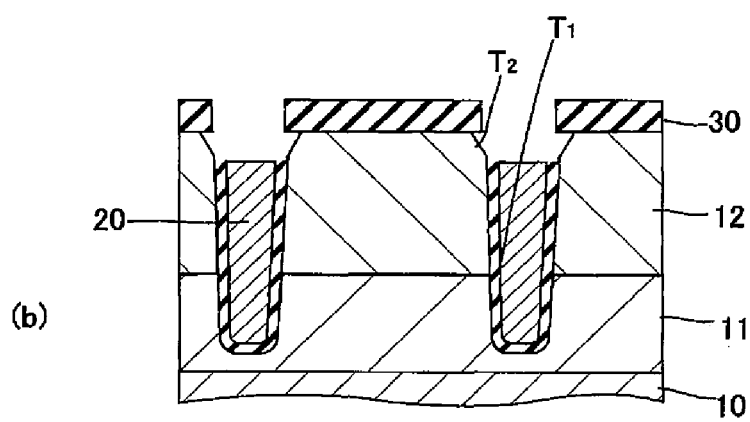
Figure 6:
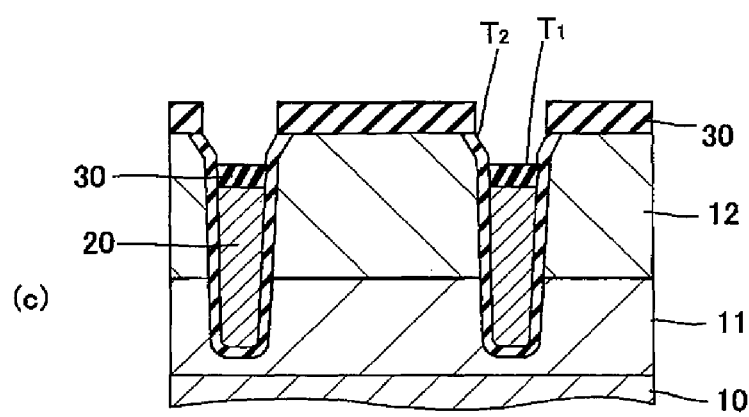

An element region and electrodes are formed, and formation of them is now described in a simplified way by reference to FIGS. 6A to 6C.

As shown in FIG. 6A, the silicon oxide film 40 is formed, through thermal oxidation, on interior walls of the trenches T formed within the epitaxial layer E on the N+-type silicon substrate 10. As shown in FIG. 6B, a polysilicon film used for forming the gate electrode 20 is additionally deposited on interiors and surfaces of the respective trenches T. The polysilicon film is then doped with impurities such that a desired doping level is accomplished.

After an embedded layer has been formed as mentioned above, the silicon oxide film 30 is formed as an interlayer insulation film by means of CVD. The silicon oxide film is subjected to etch back, thereby making the tapered surfaces $T_2$ of the respective trenches T exposed.

As shown in FIG. 6C, N-type impurities are sequentially implanted into the trenches, thereby forming the source region 13. Additionally, P-type impurities are implanted into the trenches, thereby forming the body contact region 14.

After the silicon oxide film 30 that is to serve as an interlayer insulation film has been formed by means of CVD, an aluminum layer that is to serve as the source electrode 50 is finally formed, and the thus-formed aluminum layer is patterned.

Through a round of procedures shown in FIGS. 5A to 5D and FIGS. 6A to 6C, the T-MOSFET of the present invention can be manufactured.

Although the silicon T-MOSFET using silicon has been described in connection with the embodiment, the present invention can be used for a Schottky gate FET that is free of a gate insulation film and includes gate electrodes formed directly on interiors of respective trenches and an IGBT configured so as to use a P-type substrate as the substrate.

Although the silicon T-MOSFET using silicon has been described in connection with the embodiment, the present invention can also be applied to a T-MOSFET using SiC.

The method for manufacturing a semiconductor device of the present invention is effective for a trench gate MOS transistor. In addition to the trench gate MOS transistor, the present invention can also be applied to another semiconductor device including a minute, uniform trench pattern, such as that used in the trench gate, and a trench pattern formation area accounting for the majority of a total area of the semiconductor device; for instance, an insulated trench gate bipolar transistor (a trench IGBT), and a semiconductor device including the device.

The disclosure of Japanese Patent Application No. 2010-145022 filed Jun. 25, 2010 including specification, drawings and claims is incorporated herein by reference in its entirety.

What is claimed is:

1. A semiconductor device, comprising:
a drain region formed from a semiconductor region of first conductivity type;
a body region formed from a semiconductor region of second conductivity type made on the drain region;
a source region formed from the semiconductor region of first conductivity type formed within the body region;
a body contact region that is formed in an area which lies in the body region but differs from the source region and that is formed from a highly-doped semiconductor region of second conductivity type;
trenches formed so as to extend from the source region to the drain region while passing through the body region;
a gate electrode formed within each of the trenches;
a source electrode formed so as to contact the source region and the body contact region; and
a drain electrode formed in the drain region, wherein
each of the trenches has a substantially linear tapered surface spreading outside from an edge of an opening; and
wherein an area between the source region and the source electrode filled in each of the trenches makes up a source-contact region, and
said source electrode contacts said body contact region along the tapered surface of each trench.

2. The semiconductor device according to claim 1, wherein each of the trenches has a vertical surface whose cross section extends in a vertical direction and a tapered surface that is formed along an upper edge of the vertical surface so as to extend outside from an edge of an opening; and wherein
each of the tapered surfaces is formed so as to extend from a marginal edge of an insulation film covering the gate electrode up to an upper edge of the source region.

3. The semiconductor device according to claim 1, wherein the semiconductor device is a SiMOSFET formed on a silicon substrate.

* * * * *